United States Patent
Nashner et al.

(10) Patent No.: US 9,434,197 B2
(45) Date of Patent: *Sep. 6, 2016

(54) LASER ENGRAVED REFLECTIVE SURFACE STRUCTURES

(71) Applicant: Apple Inc., Cupertino, CA (US)

(72) Inventors: Michael S. Nashner, San Jose, CA (US); Peter N. Russell-Clarke, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 539 days.

This patent is subject to a terminal disclaimer.

(21) Appl. No.: 13/921,136

(22) Filed: Jun. 18, 2013

(65) Prior Publication Data

US 2014/0370325 A1    Dec. 18, 2014

(51) Int. Cl.

| | |
|---|---|
| *H05K 5/02* | (2006.01) |
| *H05K 5/00* | (2006.01) |
| *H05K 5/04* | (2006.01) |
| *B32B 3/00* | (2006.01) |
| *B32B 15/00* | (2006.01) |
| *B41M 5/24* | (2006.01) |

(Continued)

(52) U.S. Cl.
CPC ...... *B41M 5/24* (2013.01); *B32B 3/00* (2013.01); *B32B 3/02* (2013.01); *B32B 15/00* (2013.01); *B32B 15/01* (2013.01); *B41M 5/245* (2013.01); *C23C 14/028* (2013.01); *C23C 14/048* (2013.01); *C23C 14/58* (2013.01); *C23C 14/5813* (2013.01); *Y10T 428/12389* (2015.01); *Y10T 428/12611* (2015.01); *Y10T 428/12618* (2015.01); *Y10T 428/12736* (2015.01); *Y10T 428/12764* (2015.01); *Y10T 428/12806* (2015.01); *Y10T 428/12979* (2015.01); *Y10T 428/12993* (2015.01)

(58) Field of Classification Search
CPC ........... B32B 3/00; B32B 3/02; B32B 15/00; B32B 15/01; C23C 14/048; C23C 14/028; C23C 14/58; C23C 14/5813; Y10T 428/12389; Y10T 428/12396; Y10T 428/12993; Y10T 428/12611; Y10T 428/12618; Y10T 428/12736; Y10T 428/12764; Y10T 428/12806; Y10T 428/12979

See application file for complete search history.

(56) References Cited

U.S. PATENT DOCUMENTS

| | | |
|---|---|---|
| 2,647,079 A | 7/1953 | Burnham |
| 2,812,295 A | 11/1957 | Patrick |

(Continued)

FOREIGN PATENT DOCUMENTS

| | | |
|---|---|---|
| CN | 1362125 A | 8/2002 |
| CN | 1306526 C | 3/2007 |

(Continued)

OTHER PUBLICATIONS

"DP2UV Basic System 2 W", ROBA Technology + Services GmbH, Aug. 2008, 2 pgs.

(Continued)

*Primary Examiner* — Michael E La Villa

(57) ABSTRACT

Markings on products are disclosed. In one embodiment, the products have housings and the markings are to be provided on the housings. For example, a housing for a particular product can include an outer housing surface and the markings can be provided on the outer housing surface so as to be visible from the outside of the housing. The markings may be precisely formed using a laser. Processing may be used to increase reflectivity of the markings.

23 Claims, 10 Drawing Sheets

(51) Int. Cl.
   *C23C 14/58* (2006.01)
   *C23C 14/02* (2006.01)
   *C23C 14/04* (2006.01)
   *B32B 3/02* (2006.01)
   *B32B 15/01* (2006.01)

(56) References Cited

U.S. PATENT DOCUMENTS

| | | |
|---|---|---|
| 2,990,304 A | 6/1961 | Cybriwsky et al. |
| 3,080,270 A | 3/1963 | Fritz |
| 3,316,866 A | 5/1967 | Shelton |
| 3,526,694 A | 9/1970 | Lemelson |
| 3,615,432 A | 10/1971 | Jenkins et al. |
| 3,645,777 A | 2/1972 | Sierad |
| RE28,225 E | 11/1974 | Heseltine et al. |
| 4,247,600 A | 1/1981 | Adachi et al. |
| 4,269,947 A | 5/1981 | Inata et al. |
| 4,347,428 A | 8/1982 | Conrad et al. |
| 4,531,705 A | 7/1985 | Nakagawa et al. |
| 4,547,649 A | 10/1985 | Butt et al. |
| 4,564,001 A | 1/1986 | Maeda |
| 4,651,453 A | 3/1987 | Doyle |
| 4,686,352 A | 8/1987 | Nawrot et al. |
| 4,756,771 A | 7/1988 | Brodalla et al. |
| 4,931,366 A | 6/1990 | Mullaney |
| 4,993,148 A | 2/1991 | Adachi et al. |
| 5,215,864 A | 6/1993 | Laakmann |
| 5,224,197 A | 6/1993 | Zanoni et al. |
| 5,288,344 A | 2/1994 | Peker et al. |
| 5,417,905 A | 5/1995 | Lemaire et al. |
| 5,645,964 A | 7/1997 | Nohr et al. |
| 5,719,379 A | 2/1998 | Huang et al. |
| 5,744,270 A | 4/1998 | Pearlman et al. |
| 5,789,466 A | 8/1998 | Birmingham et al. |
| 5,808,268 A | 9/1998 | Balz |
| 5,837,086 A | 11/1998 | Leeb et al. |
| 5,872,699 A | 2/1999 | Nishii et al. |
| 5,925,847 A | 7/1999 | Rademacher et al. |
| 5,943,799 A | 8/1999 | Xu et al. |
| 6,007,929 A | 12/1999 | Robertson et al. |
| 6,101,372 A | 8/2000 | Kubo |
| 6,169,266 B1 | 1/2001 | Hughes |
| 6,325,868 B1 | 12/2001 | Kim et al. |
| 6,331,239 B1 | 12/2001 | Shirota et al. |
| 6,480,397 B1 | 11/2002 | Hsu et al. |
| 6,540,867 B1 | 4/2003 | Cochran |
| 6,574,096 B1 | 6/2003 | Difonzo et al. |
| 6,590,183 B1 | 7/2003 | Yeo |
| 6,633,019 B1 | 10/2003 | Gray |
| 6,746,724 B1 | 6/2004 | Robertson et al. |
| 6,802,952 B2 | 10/2004 | Hsu et al. |
| 6,821,305 B2 | 11/2004 | Yan |
| 6,966,133 B2 | 11/2005 | Krings et al. |
| 6,996,425 B2 | 2/2006 | Watanabe |
| 7,065,820 B2 | 6/2006 | Meschter |
| 7,134,198 B2 | 11/2006 | Nakatani et al. |
| 7,181,172 B2 | 2/2007 | Sullivan et al. |
| 7,225,529 B2 | 6/2007 | Wang |
| 7,284,396 B2 | 10/2007 | Barron et al. |
| 7,459,373 B2 | 12/2008 | Yoo |
| 7,508,644 B2 | 3/2009 | Cheung et al. |
| 7,622,183 B2 | 11/2009 | Shirai et al. |
| 7,636,974 B2 | 12/2009 | Meschter et al. |
| 7,691,189 B2 | 4/2010 | En et al. |
| 8,192,815 B2 | 6/2012 | Weber et al. |
| 8,367,304 B2 | 2/2013 | Heley et al. |
| 8,379,678 B2 | 2/2013 | Zhang et al. |
| 8,379,679 B2 | 2/2013 | Zhang et al. |
| 8,451,873 B2 | 5/2013 | Zhang |
| 8,663,806 B2 | 3/2014 | Weber et al. |
| 8,761,216 B2 | 6/2014 | Zhang |
| 8,809,733 B2 | 8/2014 | Scott et al. |
| 8,842,351 B2 | 9/2014 | Lawrence et al. |
| 8,879,266 B2 | 11/2014 | Jarvis et al. |
| 8,893,975 B2 | 11/2014 | Sanford et al. |
| 8,993,921 B2 | 3/2015 | Browning et al. |
| 9,034,166 B2 | 5/2015 | Tatebe et al. |
| 9,089,932 B2 | 7/2015 | Lim |
| 9,132,510 B2 | 9/2015 | Nashner et al. |
| 9,133,559 B2 | 9/2015 | Silverman |
| 9,138,826 B2 | 9/2015 | Harrison |
| 9,173,336 B2 | 10/2015 | Bhatia |
| 9,185,835 B2 | 11/2015 | Heley et al. |
| 9,314,871 B2 | 4/2016 | Nashner et al. |
| 2001/0030002 A1 | 10/2001 | Zheng et al. |
| 2002/0058737 A1 | 5/2002 | Nishiwaki et al. |
| 2002/0097440 A1 | 7/2002 | Paricio et al. |
| 2002/0109134 A1 | 8/2002 | Iwasaki et al. |
| 2002/0130441 A1 | 9/2002 | Robinson et al. |
| 2002/0160145 A1 | 10/2002 | Bauhoff |
| 2003/0006217 A1 | 1/2003 | Dance |
| 2003/0024898 A1 | 2/2003 | Natsume et al. |
| 2003/0074814 A1 | 4/2003 | Krings et al. |
| 2003/0225189 A1 | 12/2003 | Fuller |
| 2004/0000490 A1 | 1/2004 | Chang |
| 2005/0023022 A1 | 2/2005 | Kriege et al. |
| 2005/0034301 A1 | 2/2005 | Wang |
| 2005/0115840 A1 | 6/2005 | Dolan |
| 2005/0127123 A1 | 6/2005 | Smithers |
| 2005/0158576 A1 | 7/2005 | Groll |
| 2005/0263418 A1 | 12/2005 | Bastus Cortes |
| 2006/0007524 A1 | 1/2006 | Tam |
| 2006/0055084 A1 | 3/2006 | Yamaguchi et al. |
| 2006/0066771 A1 | 3/2006 | Hayano et al. |
| 2006/0105542 A1 | 5/2006 | Yoo |
| 2006/0225918 A1 | 10/2006 | Chinda et al. |
| 2007/0018817 A1 | 1/2007 | Marmaropoulos et al. |
| 2007/0045893 A1 | 3/2007 | Asthana et al. |
| 2007/0053504 A1 | 3/2007 | Sato et al. |
| 2007/0262062 A1 | 11/2007 | Guth |
| 2007/0275263 A1 | 11/2007 | Groll |
| 2008/0152859 A1 | 6/2008 | Nagal |
| 2008/0165485 A1 | 7/2008 | Zadesky et al. |
| 2008/0166007 A1 | 7/2008 | Hankey |
| 2008/0241478 A1 | 10/2008 | Costin et al. |
| 2008/0274375 A1 | 11/2008 | Ng et al. |
| 2008/0295263 A1 | 12/2008 | Meschter et al. |
| 2008/0299408 A1 | 12/2008 | Guo et al. |
| 2008/0311369 A1 | 12/2008 | Yokoyama et al. |
| 2008/0318008 A1* | 12/2008 | Wielstra et al. ........ B26B 19/38 428/195.1 |
| 2009/0017242 A1 | 1/2009 | Weber et al. |
| 2009/0019737 A1 | 1/2009 | Moreno |
| 2009/0091879 A1 | 4/2009 | Lim |
| 2009/0104949 A1 | 4/2009 | Sato et al. |
| 2009/0136723 A1 | 5/2009 | Zhao |
| 2009/0190290 A1 | 7/2009 | Lynch et al. |
| 2009/0194444 A1 | 8/2009 | Jones |
| 2009/0197116 A1 | 8/2009 | Cheng et al. |
| 2009/0236143 A1 | 9/2009 | Nakamura |
| 2009/0260871 A1 | 10/2009 | Weber et al. |
| 2009/0305168 A1 | 12/2009 | Heley et al. |
| 2010/0015578 A1 | 1/2010 | Falsafi et al. |
| 2010/0061039 A1 | 3/2010 | Sanford et al. |
| 2010/0065313 A1 | 3/2010 | Takeuchi et al. |
| 2010/0159273 A1 | 6/2010 | Filson et al. |
| 2010/0183869 A1 | 7/2010 | Lin et al. |
| 2010/0209721 A1 | 8/2010 | Irikura et al. |
| 2010/0209731 A1 | 8/2010 | Hamano |
| 2010/0294426 A1 | 11/2010 | Nashner |
| 2010/0300909 A1 | 12/2010 | Hung |
| 2011/0008618 A1 | 1/2011 | Weedlun |
| 2011/0048755 A1 | 3/2011 | Su et al. |
| 2011/0051337 A1 | 3/2011 | Weber et al. |
| 2011/0089039 A1 | 4/2011 | Nashner |
| 2011/0089067 A1 | 4/2011 | Scott et al. |
| 2011/0123737 A1 | 5/2011 | Nashner et al. |
| 2011/0155901 A1 | 6/2011 | Vestal |
| 2011/0186455 A1 | 8/2011 | Du et al. |
| 2011/0193928 A1 | 8/2011 | Zhang et al. |
| 2011/0193929 A1 | 8/2011 | Zhang et al. |
| 2011/0194574 A1 | 8/2011 | Zhang et al. |
| 2011/0253411 A1 | 10/2011 | Hum et al. |
| 2011/0315667 A1 | 12/2011 | Reichenbach et al. |

(56) References Cited

U.S. PATENT DOCUMENTS

| | | |
|---|---|---|
| 2012/0043306 A1 | 2/2012 | Howerton et al. |
| 2012/0081830 A1 | 4/2012 | Yeates et al. |
| 2012/0100348 A1 | 4/2012 | Brookhyser et al. |
| 2012/0248001 A1 | 10/2012 | Nashner |
| 2012/0275130 A1 | 11/2012 | Hsu et al. |
| 2013/0075126 A1 | 3/2013 | Nashner et al. |
| 2013/0083500 A1 | 4/2013 | Prest et al. |
| 2013/0129986 A1 | 5/2013 | Heley et al. |
| 2014/0009873 A1 | 1/2014 | Nashner |
| 2014/0134429 A1 | 5/2014 | Weber et al. |
| 2014/0186654 A1 | 7/2014 | Zhang |
| 2014/0363608 A1 | 12/2014 | Russell-Clarke et al. |
| 2014/0367369 A1* | 12/2014 | Nashner et al. ... B23K 26/0081 219/121.66 |
| 2014/0370325 A1 | 12/2014 | Nashner et al. |
| 2015/0093563 A1 | 4/2015 | Runge et al. |
| 2015/0132541 A1 | 5/2015 | McDonald et al. |
| 2015/0176146 A1 | 6/2015 | Browning et al. |

FOREIGN PATENT DOCUMENTS

| | | |
|---|---|---|
| CN | 201044438 Y | 2/2008 |
| CN | 101204866 | 6/2008 |
| CN | 102173242 A | 9/2011 |
| DE | 195 23 112 | 6/1996 |
| DE | 102005048870 A1 | 4/2007 |
| EP | 0031463 | 7/1981 |
| EP | 0 114 565 A1 | 8/1984 |
| EP | 121150 A1 | 10/1984 |
| EP | 0234121 | 9/1987 |
| EP | 0 633 585 A | 1/1995 |
| EP | 2 399 740 A1 | 12/2011 |
| EP | 2488369 B1 | 3/2014 |
| GB | 788 329 A | 12/1957 |
| JP | 57-149491 A | 9/1982 |
| JP | 03 013331 A | 1/1991 |
| JP | 03 138131 A | 6/1991 |
| JP | 3-203694 A | 9/1991 |
| JP | 06-126192 | 5/1994 |
| JP | A H06-212451 | 8/1994 |
| JP | 06-320104 | 11/1994 |
| JP | 7-204871 A | 8/1995 |
| JP | 2000-000167 | 1/2000 |
| JP | 2002/370457 | 12/2002 |
| JP | 2003055794 | 2/2003 |
| JP | 2005/22924 | 1/2005 |
| JP | A2006-138002 | 6/2006 |
| JP | 2008 087409 A | 4/2008 |
| WO | WO 98/53451 | 11/1998 |
| WO | EP 0 997 958 A1 | 5/2000 |
| WO | WO 0077883 | 12/2000 |
| WO | WO 01/15916 A1 | 3/2001 |
| WO | WO 01/34408 | 5/2001 |
| WO | WO 2006/124279 A2 | 11/2006 |
| WO | WO 2007/088233 A1 | 8/2007 |
| WO | WO 2008/092949 A1 | 8/2008 |
| WO | WO 2009/051218 A1 | 4/2009 |
| WO | WO 2010/095747 A1 | 8/2010 |
| WO | WO 2010/111798 A1 | 10/2010 |
| WO | WO 2010/135415 | 11/2010 |
| WO | WO 2010/135415 A2 | 11/2010 |
| WO | WO 2011/047325 A1 | 4/2011 |

OTHER PUBLICATIONS

International Search Report for International Patent Application No. PCT/US2014/041236, mailed Sep. 17, 2014.

Written Opinion for International Patent Application No. PCT/US2014/041236, mailed Sep. 17, 2014.

Bereznai et al., "Surface Modifications Induced by NS and Sub-PS Excimer Laser Pulses on Titanium Implated Material", Bio Materials, Elsevier Science Publishers vol. 24, No. 23, Oct. 1, 2003, pp. 4197-4203.

Lopez et al., "Comparison of picosecond and femtosecond laser ablation for surface engraving of metals and semiconductors", Proceedings of Spie, vol. 8243, Feb. 9, 2012, p. 824300.

Rusu et al., "Titanium Alloy Nanosecond vs. femtosecond laser marking", Applied Surface Science, vol. 259, Oct. 1, 2012, pp. 311-319.

Shah, Vishu, Handbook of Plastics Testing and Failure Analysis, John Wiely & Sons;, Inc., Third Edition, Jun. 14, 2006.

Annerfors et al., "Nano Molding Technology on Cosmetic Aluminum Parts in Mobile Phones", Division of Production and Materials Engineering, LTH, 2007.

"Thermal Shock Resistant Conformal Coating", Product Data Sheet, Dymax Corporation, Jul. 9, 2007, pp. 1-2.

"Marking Lasers: Marking without Limitations", Trumpf Inc., Sep. 10, 2007, pp. 1-36.

"UV-Curing Sheet Adhesives", ThreeBond Technical News, Issued Jul. 1, 2009, 8 pages.

Chang, "Lasers Make Other Metals Look Like Gold", New York Times, nytimes.com, 2 pgs., Jan. 31, 2008.

"Database EPI" Week 201107 Thomas Scientific, London, GB; AN 2010-Q46184, Nov. 17, 2010, 1 pg.

Hajdu, "Chapter 7", 1990, William Andrew Publishing from www.knovel.com, pp. 193-206.

http://dba.med.sc.edu/price/irf/Adobe_tg_models/cielab.html,published 2000.

Lewis, "Hawley's Condensed Chemical Dictionary", 12th edition, Van Nostrand Reinhold company, New York, 1993. excerpt p. 1075.

Webster's Nine to New Collegiate Dictionary; Merriam-Webster Inc., 1990, excerpt p. 412.

\* cited by examiner

LASER ENGRAVED REFLECTIVE SURFACE STRUCTURES

BACKGROUND OF THE INVENTION

Consumer products, such as electronic devices, have been marked with different information for many years. For example, it is common for electronic devices to be marked with a serial number, model number, copyright information and the like. Conventionally, such marking is done with an ink printing or stamping process. Although conventional ink printing and stamping is useful for many situations, such techniques can be inadequate in the case of handheld electronic devices. Ink printing and stamping may not be very durable for handheld devices. Further, the small form factor of handheld electronic devices, such as mobile phones, portable media players and Personal Digital Assistants (PDAs), requires that the marking be very small. In order for such small marking to be legible, the marking must be accurately and precisely formed. Unfortunately, however, conventional techniques are not able to offer sufficient accuracy and precision. Thus, there is a need for improved techniques to mark products.

SUMMARY

The invention pertains to providing markings on products. In one embodiment, the products have housings and the markings are to be provided on the housings. For example, a housing for a particular product can include an outer housing surface and the markings can be provided on the outer housing surface so as to be visible from the outside of the housing. The markings provided on products can be textual and/or graphic. The markings can be formed with high resolution and/or precision using a laser. Processing may be used to increase reflectivity of the markings. The markings are also able to be light or dark, even on metal surfaces.

In general, the markings (also referred to as annotations or labeling) provided on products according to the invention can be textual and/or graphic. The markings can be used to provide a product (e.g., a product's housing) with certain information. The marking can, for example, be used to label the product with various information. When a marking includes text, the text can provide information concerning the product (e.g., electronic device). For example, the text can include one or more of: name of product, trademark or copyright information, design location, assembly location, model number, serial number, license number, agency approvals, standards compliance, electronic codes, memory of device, and the like. When a marking includes a graphic, the graphic can pertain to a logo, a certification mark, standards mark or an approval mark that is often associated with the product. The marking can be used for advertisements to be provided on products. The markings can also be used for customization (e.g., user customization) of a housing of a product.

The invention can be implemented in numerous ways. Several embodiments of the invention are discussed below.

As an electronic device housing, one embodiment of the invention can, for example, include at least a substrate of the electronic device housing, the substrate having an outer surface, and recessed markings disposed on the outer surface the substrate of the electronic device housing. The recessed markings may comprise an athermally ablated surface layer, and a plurality of melted regions overlaying the athermally ablated surface layer.

As another embodiment, an apparatus can, for example, include at least a substrate having an outer surface, and first and second recessed markings disposed on the outer surface of the substrate. The first and second recessed markings can have contrasting appearances. Each of the first and second recessed markings may comprise a respective ablated surface layer.

As another embodiment, an apparatus can, for example, include at least a substrate having an outer surface and recessed markings arranged in one or more textual or graphical indicia on the outer surface the substrate. The recessed markings may comprise an athermally ablated surface layer, and a plurality of melted regions overlaying the athermally ablated surface layer.

As another embodiment, an apparatus can, for example, include at least a substrate having an outer surface, and recessed markings arranged in a tactile texture on the outer surface the substrate. The recessed markings may comprise an athermally ablated surface layer, and a plurality of melted regions overlaying the athermally ablated surface layer.

Other aspects and advantages of the invention will become apparent from the following detailed description taken in conjunction with the accompanying drawings which illustrate, by way of example, the principles of the invention.

BRIEF DESCRIPTION OF THE DRAWINGS

Illustrative embodiments by way of examples, not by way of limitation, are illustrated in the drawings. Throughout the description and drawings, similar reference numbers may be used to identify similar elements. The drawings are for illustrative purpose to assist understanding and may not be drawn per actual scale.

DETAILED DESCRIPTION OF EMBODIMENTS OF THE INVENTION

The invention pertains to techniques or processes for providing engravings and/or markings on products. In one embodiment, the products have housings and the markings are to be provided on the housings. For example, a housing for a particular product can include an outer housing surface and the markings can be provided on the outer housing surface so as to be visible from the outside of the housing. The markings provided on products can be textual and/or graphic. The markings can be formed with high resolution and/or precision using a laser. Processing may be used to increase reflectivity of the markings. The markings are also able to be light or dark, even on metal surfaces.

In general, the markings (also referred to as annotations or labeling) provided on products according to the invention can be textual and/or graphic. The markings can be used to provide a product (e.g., a product's housing) with certain information. The marking can, for example, be used to label the product with various information. When a marking includes text, the text can provide information concerning the product (e.g., electronic device). For example, the text can include one or more of: name of product, trademark or copyright information, design location, assembly location, model number, serial number, license number, agency approvals, standards compliance, electronic codes, memory of device, and the like. When a marking includes a graphic, the graphic can pertain to a logo, a certification mark, standards mark or an approval mark that is often associated with the product. The marking can be used for advertisements to be provided on products. The markings can also be used for customization (e.g., user customization) of a housing of a product.

Example embodiments of the invention are discussed below with reference to FIGS. 1-11. However, those skilled in the art will readily appreciate that the detailed description given herein with respect to these figures is for explanatory purposes as the invention extends beyond these limited embodiments.

Figure 1:
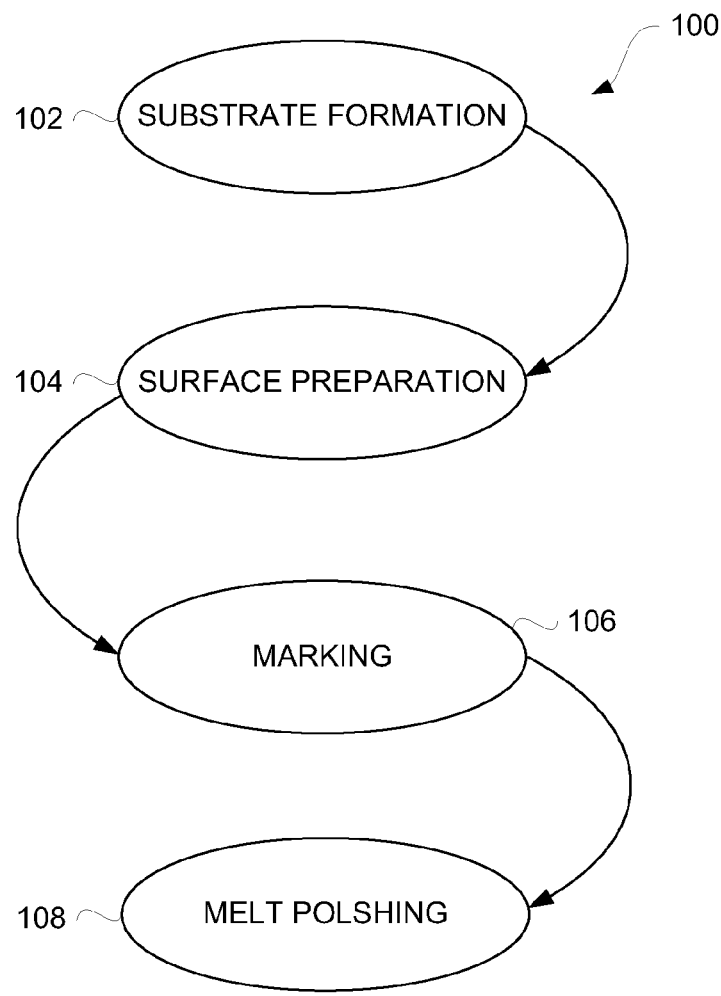
FIG. 1 is a diagram of a marking state machine according to one embodiment of the invention.

FIG. 1 is a diagram of a marking state machine 100 according to one embodiment of the invention. The marking state machine 100 reflects three (4) basic states associated with marking an electronic device. Specifically, the marking can mark a housing of an electronic device, such as a portable electronic device.

The marking state machine 100 includes a substrate formation state 102. At the substrate formation state 102, a substrate can be obtained or produced. For example, the substrate can represent at least a portion of a housing surface of an electronic device. Next, the marking state machine 100 can transition to a surface preparation state 104. At the surface preparation state 104, the surface can be prepared, for example using bead blasting.

A protective surface can be formed or applied to at least one surface of the substrate. The protective surface can be used to protect the surface of the substrate. For example, the protective surface can be a more durable surface than that of the surface. For example, the substrate can be a metal substrate, the surface can be a metal surface, and the metal can be anodized so that the protective surface can be an anodized surface.

Next, the marking state machine 100 can transition to a marking state 106. At the marking state 106, marking can be produced on the substrate. The marking can be provided with high resolution. Next, the marking state machine 100 can transition to a melt polish state 108. The marking can be polished using a thermal process, which can melt light scattering features. Prior to melting, light scattering features may dull and/or darken appearance of the markings. Alternatively or additionally, the light scattering features may be designated as surface roughness, which may be on the nanometer scale and/or may be on the micrometer scale (and which may result from the substantially athermal ablation.) Melting of light scattering features may provide polishing, so as to brighten and/or lighten appearance of the markings. Alternatively or additionally, such melting may be designated as surface reflow and/or surface melting.

Figure 2:
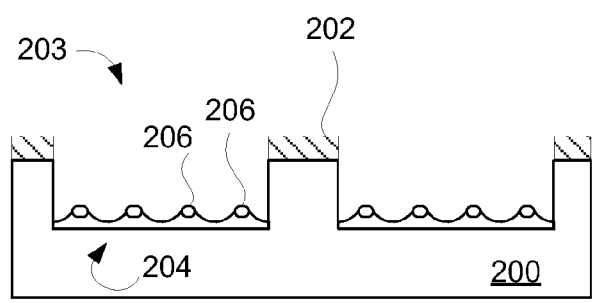
FIG. 2 is an illustration of a substrate having markings according to one embodiment.

FIG. 2 is an illustration of a substrate 200 having recessed markings 203 according to one embodiment. The substrate 200 can represent at least a portion of a housing of an electronic device. The markings 203 being provided to the substrate can provide text and/or graphics to an outer housing surface of a portable electronic device. Alternatively or additionally, in some embodiments the markings 203 may be arranged in a tactile texture on the outer surface the substrate 200. In some embodiments, the tactile texture may comprise knurling. The marking techniques are particularly useful for smaller scale portable electronic devices, such as handheld electronic devices. Examples of handheld electronic devices include mobile telephones (e.g., cell phones), Personal Digital Assistants (PDAs), portable media players, remote controllers, pointing devices (e.g., computer mouse), game controllers, etc.

The markings 203 are, in one embodiment, particularly well-suited for applying text and/or graphics to a housing of an electronic device. As noted above, the substrate can represent a portion of a housing of an electronic device. Examples of electronic devices, namely, handheld electronic devices, include mobile telephones (e.g., cell phones), Personal Digital Assistants (PDAs), portable media players, remote controllers, pointing devices (e.g., computer mouse), game controllers, etc.

The substrate 200 may having an outer surface 202, and recessed markings 203 may be disposed on or adjacent the outer surface 202 the substrate of the electronic device housing. As mentioned previously, the substrate 200 of the electronic device housing may comprise metal. For example, the substrate 200 may comprise one of aluminum, titanium and stainless steel. The outer surface 202 of the substrate 200 may bead blasted and/or may be anodized, as highlighted in FIG. 2 by hatching of outer surface 202. Accordingly, it should be understood that the substrate 200 may comprise anodized metal.

As shown in FIG. 2, the recessed markings 203 may comprise an athermally ablated surface layer 204, and a plurality of melted regions 206 overlaying the athermally ablated surface layer 204. The athermally ablated surface layer 204 and/or the plurality of melted regions 206 overlaying the athermally ablated surface layer 204 may be substantially optically smooth.

The plurality of melted regions 206 may have a substantially glossy appearance. The plurality of melted regions 206 overlaying the athermally ablated surface layer 204 may have a level of specular reflection that is substantially similar to a level of specular reflection of the outer surface 202 of the electronic device housing.

As mentioned previously, at least a portion of the outer surface 202 of the electronic device housing may have a bead blasted appearance. The plurality of melted regions 206 overlaying the athermally ablated surface layer 204 may have an appearance that is substantially similar to the bead blasted appearance of the outer surface 202 of the electronic device housing.

As shown in FIG. 2, the recessed markings 203 may comprise at least one sidewall adjacent to the athermally ablated surface layer 204. The outer surface 202 of the substrate 200 is substantially perpendicular to the sidewall adjacent to the athermally ablated surface layer 204. As will be discussed in greater detail subsequently herein, short duration laser pulses may used to provide for substantially athermal ablation, which may help to provide such steep sidewalls. The appearance of such steep sidewalls may be desirable for the recessed markings 203. Further, since the athermally ablated surface layer 204 may be ablated substantially athermally, this may provide an appearance of the outer surface 202 that is substantially free of thermal artifacts, such as burr, melt and/or discoloration of the outer surface 202, which may be desirable to substantially avoid.

Figure 3:
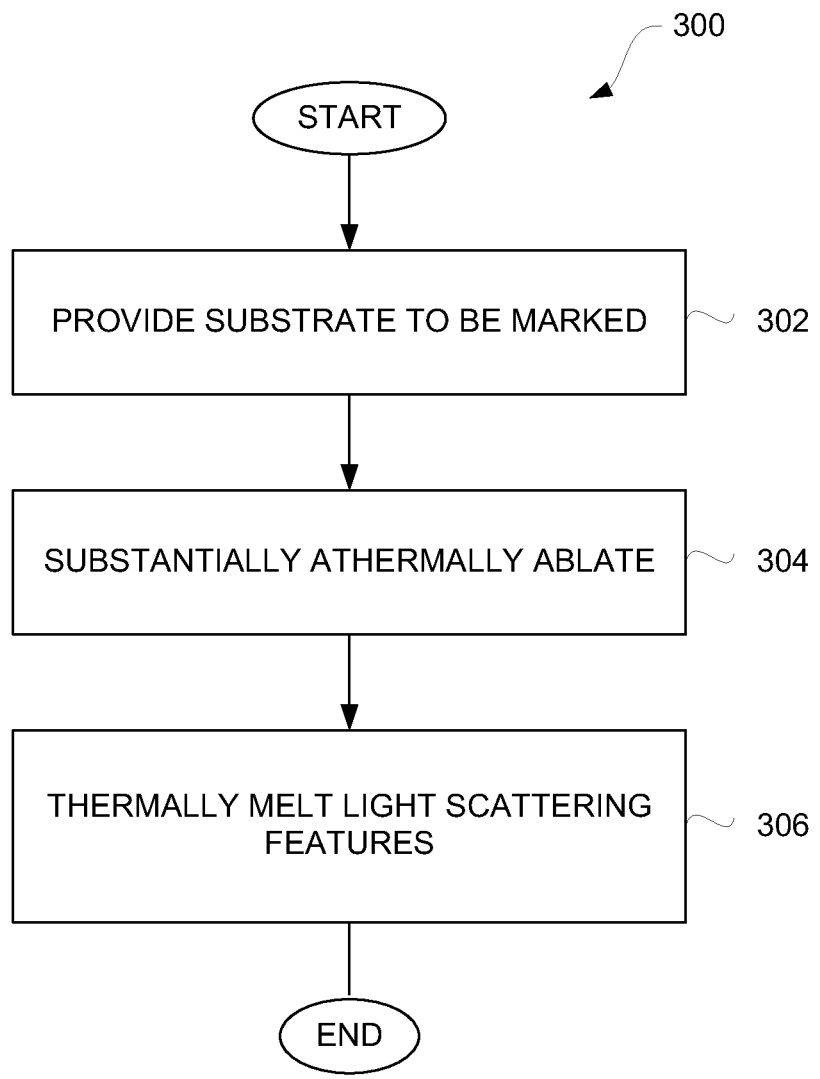
FIG. 3 is a flow diagram of a marking process according to one embodiment.

FIG. 3 is a flow diagram of a marking process 300 according to one embodiment. The marking process 300 can be performed on an electronic device that is to be marked. The marking process 300 is for example, suitable for applying text or graphics to a housing (e.g., an outer housing surface) of an electronic device. The marking can be provided such that it is visible to users of the electronic device. However, the marking can be placed in various different positions, surfaces or structures of the electronic device.

The marking process can provide a metal structure and/or metal substrate for an article to be marked. The metal may comprise one of aluminum, titanium and stainless steel. The metal may be anodized.

The metal structure and/or metal substrate can pertain to a metal housing for an electronic device, such as a portable electronic device, to be marked. The metal structure and/or metal substrate can be formed of one metal layer. The metal structure and/or metal substrate can also be formed of multiple layers of different materials, where at least one of the multiple layers is a metal layer.

In accordance with the marking process 300 shown in FIG. 3, the process may begin with providing 302 the substrate to be marked. As mentioned previously, the substrate may have an outer surface. In some embodiments the outer surface may be bead blasted and/or anodized.

After the substrate of the electronic device housing has been provided 302, the outer surface of the substrate may be substantially athermally ablated 304, so as to provide an athermally ablated surface layer of markings recessed into the outer surface of the substrate.

Substantially athermally ablating 304 the outer surface of the substrate may comprise using a laser pulse having a laser pulse duration that is sufficiently short for ablating the outer surface substantially athermally. For example, as will be discussed in greater detail subsequently herein, for laser light having a wavelength of approximately one-thousand-sixty-four nanometers (1064 nm), a laser pulse duration of approximately fifteen picoseconds at approximately one Watt may be sufficiently short for ablating the outer surface substantially athermally. Athermal ablation may be substantial as a significant aspect of the ablation. Athermal ablation may be substantial in that athermal ablation processes may predominate in effect over other processes.

Substantially athermally ablating the outer surface of the substrate may comprise forming at least one sidewall of the markings recessed into the outer surface of the substrate, wherein the outer surface of the substrate may be substantially perpendicular to the sidewall. The short duration laser pulses as just discussed may provide for substantially athermal ablation, and further may help to provide such steep sidewalls. As mentioned previously herein, the appearance of such steep sidewalls may be desirable for the recessed markings. Further, since the athermally ablated surface layer may be ablated substantially athermally, this may provide an appearance of the outer surface that is substantially free of thermal artifacts, such as burr, melt and/or discoloration of the outer surface 202, which may be desirable to substantially avoid. In other words, substantially athermally ablating the outer surface of the substrate may substantially avoid an appearance of thermal artifacts at the outer surface.

As a result of the substantially athermal ablation, a plurality of light scattering features may be overlain on the athermally ablated surface layer. The light scattering features may be undesirable, and may dull and/or darken appearance of the markings. As will be discussed next, melting of light scattering features may provide polishing, so as to brighten and/or lighten appearance of the markings.

After the outer surface of the substrate has been substantially athermally ablated 304, the plurality of light scattering features may be thermally melted 306, so as to provide a plurality of melted regions overlaying the athermally ablated surface layer. Thermally melting 306 the plurality of light scattering features may comprise using a laser pulse having a laser pulse duration that is sufficiently long for thermally melting the plurality of light scattering features. For example, as will be discussed in greater detail subsequently herein, for laser light having a wavelength of approximately one-thousand-sixty-four nanometers (1064 nm), a laser pulse duration of approximately thirty nanoseconds at approximately seven Watts may be sufficiently long for thermally melting the plurality of light scattering features.

Accordingly, from the foregoing it should be understood that substantially athermally ablating 304 the outer surface of the substrate may comprise using a first laser pulse having a first laser pulse duration. Further, thermally melting 306 the plurality of light scattering features may comprise using a second laser pulse having a second laser pulse duration that is substantially longer than the first laser pulse duration.

Thermally melting 306 the plurality of light scattering features may comprise making the plurality of melted regions substantially optically smooth. The plurality of melted regions may have a substantially glossy appearance.

Furthermore, the plurality of melted regions overlaying the athermally ablated surface layer may have a level of specular reflection that is substantially similar to a level of specular reflection of the outer surface of the electronic device housing. As mentioned previously, the outer surface of the electronic device housing may be bead blasted, so that at least a portion of the outer surface of the electronic device housing may have a bead blasted appearance. The plurality of melted regions overlaying the athermally ablated surface layer may have an appearance that is substantially similar to the bead blasted appearance of the outer surface of the electronic device housing. Following the block 306 of thermally melting the plurality of light scattering features, the marking process 300 shown in FIG. 3 can end.

FIGS. 4A-4D are diagrams illustrating marking of a substrate according to one embodiment. FIGS. 4A-4D illustrate a substrate 400, which may be a metal substrate 400. For example, the substrate 400 may comprise one of aluminum, titanium and stainless steel.

Figure 4A:
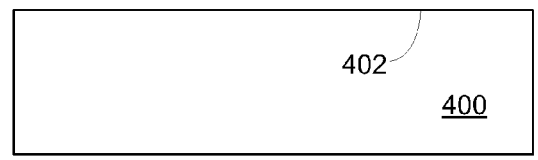
FIGS. 4A-4D are diagrams illustrating marking of a substrate according to one embodiment.
Figure 4B:
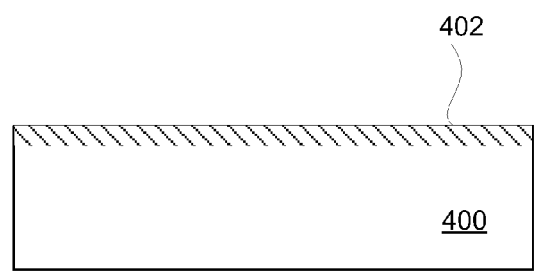

As shown in FIG. 4A, the substrate 400 may have an outer surface 402. The outer surface 402 of the substrate 400 may bead blasted and/or may be anodized, as highlighted in FIGS. 4B-4D by hatching of outer surface 402. For example, FIG. 4B highlights with hatching the outer surface 402, which may be bead blasted and/or may be anodized.

Figure 4C:
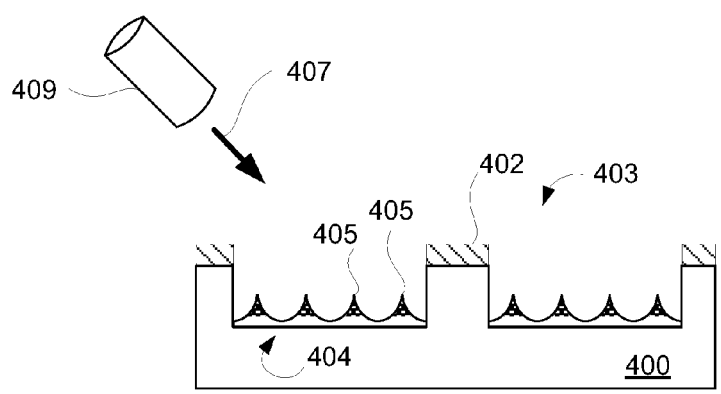

As shown in FIG. 4C, recessed markings 403 may be formed by suitably selected optical energy 407 produced by a suitably selected and operated laser 409. The outer surface 402 of the substrate 400 may be substantially athermally ablated by a first laser 409, so as to provide an athermally ablated surface layer 404 of markings 403 recessed into the outer surface 402 of the substrate 400. In some embodiments, the outer surface 402 of the substrate 400 may be laser ablated under the action of a substantially athermal shock wave induced by the laser 409, so as to provide a shock ablated surface layer 404 of markings 403 recessed into the outer surface 402 of the substrate 400. Accordingly, the athermally ablated surface layer 404 may be alternatively or additionally designated as the shock ablated surface layer 404.

The first laser 409 may include a galvanometer mirror or other arrangement for raster scanning a spot of the optical energy over the outer surface 402, so as to form the recessed markings 403. For example, laser pulses 407 from the first laser 409 may have a repetition rate of approximately one-thousand kilohertz (1000 kHz); and the spot of optical energy may be scanned at a rate of approximately two-thousand millimeters per second 2000 mm/sec). The spot of optical energy may be scanned in multiple passes of scan lines separated by a scan line pitch. For example, the spot of optical energy may be scanned in approximately two-hundred passes of scan lines separated by a scan line pitch of approximately ten microns.

Various alternatives may be suitable laser models, for use as the first laser 409 in marking the substrate 400. One example is the Lumera Hyper Rapid. The Lumera Hyper Rapid is a picosecond type laser. The Lumera Hyper Rapid is available from Coherent, Inc., having an office at 5100 Patrick Henry Drive Santa Clara, Calif. 95054 USA.

Substantially athermally ablating the outer surface 402 of the substrate 400 may comprise using a laser pulse 407 having a laser pulse duration that is sufficiently short for ablating the outer surface 402 substantially athermally. For example, first laser 409 may provide laser light 407 having a wavelength of approximately one-thousand-sixty-four nanometers (1064 nm), and a laser pulse duration of approximately fifteen picoseconds at approximately one Watt, which may be sufficiently short for ablating the outer surface 402 substantially athermally. Athermal ablation may be substantial as a significant aspect of the ablation. Athermal ablation may be substantial in that athermal ablation processes may predominate in effect over other processes.

The substrate 400 shown in FIG. 4C can represent at least a portion of a housing of an electronic device. The recessed markings 403 may be disposed on or adjacent the outer surface 402 the substrate 400 of the electronic device housing. The markings 403 being provided to the substrate 400 can provide text and/or graphics to an outer housing surface of a portable electronic device. As mentioned previously, the marking techniques are particularly useful for smaller scale portable electronic devices, such as handheld electronic devices. Examples of handheld electronic devices include mobile telephones (e.g., cell phones), Personal Digital Assistants (PDAs), portable media players, remote controllers, pointing devices (e.g., computer mouse), game controllers, etc.

The markings 403 are, in one embodiment, particularly well-suited for applying text and/or graphics to a housing of an electronic device. As noted above, the substrate can represent a portion of a housing of an electronic device. Examples of electronic devices, namely, handheld electronic devices, include mobile telephones (e.g., cell phones), Personal Digital Assistants (PDAs), portable media players, remote controllers, pointing devices (e.g., computer mouse), game controllers, etc.

As shown in FIG. 4C, substantially athermally ablating the outer surface 402 of the substrate 400 may comprise forming at least one sidewall of the markings 403 recessed into the outer surface 402 of the substrate 400, wherein the outer surface 402 of the substrate 400 may be substantially perpendicular to the sidewall. The short duration laser pulses as just discussed may provide for substantially athermal ablation, and further may help to provide such steep sidewalls. As mentioned previously herein, the appearance of such steep sidewalls may be desirable for the recessed markings 403. Further, since the athermally ablated surface layer 404 may be ablated substantially athermally, this may provide an appearance of the outer surface 402 that is substantially free of thermal artifacts, such as burr, melt and/or discoloration of the outer surface 402, which may be desirable to substantially avoid. In other words, substantially athermally ablating the outer surface 402 of the substrate 400 may substantially avoid an appearance of thermal artifacts at the outer surface 402 of the substrate 400.

As a result of the substantially athermal ablation, a plurality of light scattering features 405 may be overlain on the athermally ablated surface layer (the light scattering features 405 are highlighted in FIG. 4C using dark stippling.) The light scattering features 405 may be undesirable, and may dull and/or darken appearance of the markings 403. As will be discussed in greater detail subsequently herein with respect to FIG. 4D, thermally melting of the light scattering features 405 may provide polishing, so as to brighten and/or lighten appearance of the markings.

Figure 4D:
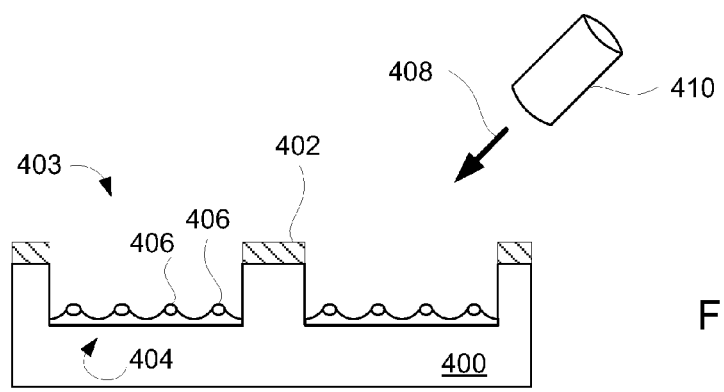

As shown in FIG. 4D, the light scattering regions as just discussed may be thermally melted to form a plurality of melted regions 406 overlaying the athermally ablated surface layer 404. The plurality of melted regions 406 may be formed by suitably selected optical energy 408 produced by a suitably selected and operated laser 410, which may be designated as a second laser 410. Accordingly, the plurality of melted regions 406 may be formed by a second laser 410. The second laser 410 shown in FIG. 4D may be substantially different than the first laser 409 discussed previously herein with respect to FIG. 4C. Alternatively or additionally laser 409 and laser 410 may be distinguished by employing substantially different laser operating parameters.

The second laser 410 shown in FIG. 4D may include a galvanometer mirror or other arrangement for raster scanning a spot of the optical energy of the second laser 410 over the recessed markings 403, so as to form the plurality of melted regions 406 overlaying the athermally ablated surface layer 404. For example, laser pulses 408 from the second laser 410 may have a repetition rate of approximately one-hundred kilohertz (100 kHz); and the spot of optical energy of the second laser 410 may be scanned at a rate of approximately twenty millimeters per second (2000 mm/sec). The spot of optical energy may be scanned in one or more passes of scan lines separated by a scan line pitch. For example, the spot of optical energy may be scanned in one pass of scan lines separated by a scan line pitch of approximately ten microns.

Various alternatives may be suitable laser models, for use as the second laser 410 in forming the plurality of melted regions 406 overlaying the athermally ablated surface layer 404. One example is the FOBA DP20GS. The FOBA DP20GS is a Diode Pumped Solid State Neodymium-Doped Yttrium Orthovanadate (DPSS YVO4) type laser, which is available from FOBA Technology and Services GmbH, having offices at 159 Swanson Road, Boxborough, Mass.

A laser pulse 408 of the second laser 410 may have a laser pulse duration that is sufficiently long for thermally melting the plurality of light scattering features, so as to form the plurality of melted regions 406 overlaying the athermally ablated surface layer 404 as shown in FIG. 4D. For example, for laser light 408 from the second laser 410 having a wavelength of approximately one-thousand-sixty-four nanometers (1064 nm), a laser pulse duration of approximately thirty nanoseconds at approximately seven Watts may be sufficiently long for thermally melting the plurality of light scattering features.

Accordingly, from the previous discussion of FIG. 4C, it should be understood that substantially athermally ablating the outer surface of the substrate may comprise using a first laser pulse having a first laser pulse duration. Further, from the subsequent discussion of FIG. 4D, it should be understood that thermally melting the plurality of light scattering features (so as to form the plurality of melted regions 406) may comprise using a second laser pulse having a second laser pulse duration that is substantially longer than the first laser pulse duration.

Additionally, it should be understood that the recessed markings 403 shown in FIG. 4D may comprise an athermally ablated surface layer 404, and a plurality of melted regions 406 overlaying the athermally ablated surface layer 404, as shown in FIG. 4D. The athermally ablated surface layer 404 and/or the plurality of melted regions 406 overlaying the athermally ablated surface layer 404 may be substantially optically smooth.

The plurality of melted regions 406 may have a substantially glossy appearance. The plurality of melted regions 406 overlaying the athermally ablated surface layer 404 may have a level of specular reflection that is substantially similar to a level of specular reflection of the outer surface 402 of the electronic device housing.

As mentioned previously, at least a portion of the outer surface 402 of the electronic device housing may have a bead blasted appearance. The plurality of melted regions 406 overlaying the athermally ablated surface layer 404 may have an appearance that is substantially similar to the bead blasted appearance of the outer surface 402 of the electronic device housing.

Figure 5:
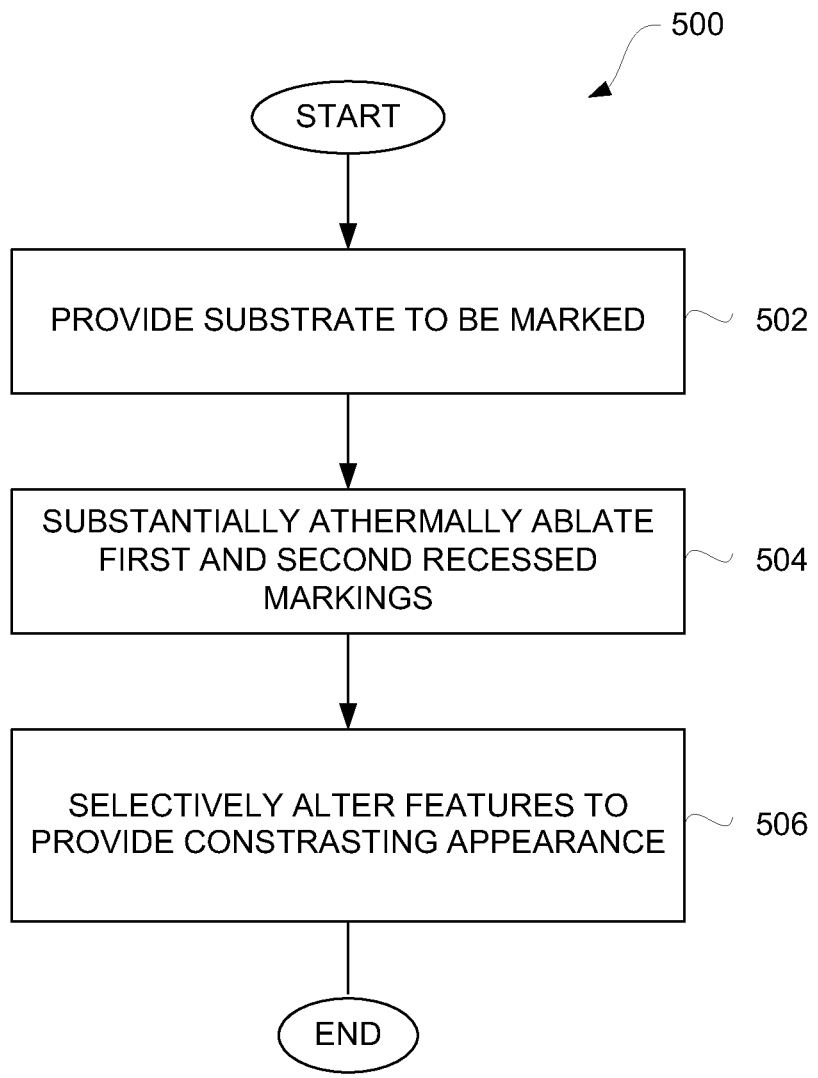
FIG. 5 is a flow diagram of a marking process according to another embodiment.

FIG. 5 is a flow diagram of a marking process 500 according to another embodiment. The marking processes 500 can be performed on an electronic device that is to be marked, or more generally on an article to be marked. In accordance with the marking process 500 shown in FIG. 5, the process may begin with providing 502 the substrate to be marked. As mentioned previously, the substrate may have an outer surface. In some embodiments the outer surface may be bead blasted and/or anodized.

After the substrate has been provided 502, the outer surface of the substrate may be substantially athermally ablated 504, so as to provide first and second recessed markings disposed on the outer surface of the substrate. Each of the first and second recessed markings may comprise a respective ablated surface having a respective plurality of light scattering features overlain thereon.

Substantially athermally ablating 504 the outer surface of the substrate may comprise using a laser pulse having a laser pulse duration that is sufficiently short for ablating the outer surface substantially athermally. For example, as already discussed, for laser light having a wavelength of approximately one-thousand-sixty-four nanometers (1064 nm), a laser pulse duration of approximately fifteen picoseconds at approximately one Watt may be sufficiently short for ablating the outer surface substantially athermally. Athermal ablation may be substantial as a significant aspect of the ablation. Athermal ablation may be substantial in that athermal ablation processes may predominate in effect over other processes.

As a result of the substantially athermal ablation, a plurality of light scattering features may be overlain on the athermally ablated surface layer. The light scattering features may dull and/or darken appearance of the markings. As will be discussed next, the plurality of light scattering features of one of the first and second recessed markings may be selectively altered so that the first and second recessed markings can have contrasting appearances. Melting of light scattering features may provide polishing, so as to brighten and/or lighten appearance of one of the markings. Further, selective melt polishing may provide contrasting appearance, by melt polishing one of the markings but not the other of the markings.

Accordingly, after the outer surface of the substrate has been substantially athermally ablated 504 to form the first and second recessed markings, the plurality of light scattering features of one of the first and second recessed markings may be selectively altered 506, so that the first and second recessed markings can have contrasting appearances. Selectively altering 506 the plurality of light scattering features of one of the first and second recessed markings may comprise thermally melting the plurality of light scattering features of the first recessed marking, so that the first recessed marking has a substantially lighter appearance than the second recessed marking.

For example, selectively altering 506 may comprise thermally melting the plurality of light scattering features of the first recessed marking using a laser pulse having a laser pulse duration that is sufficiently long for thermally melting the plurality of light scattering features. For example, as discussed previously herein, for laser light having a wavelength of approximately one-thousand-sixty-four nanometers (1064 nm), a laser pulse duration of approximately thirty nanoseconds at approximately seven Watts may be sufficiently long for thermally melting the plurality of light scattering features.

Accordingly, from the foregoing it should be understood that substantially athermally ablating 504 the outer surface of the substrate may comprise using a first laser pulse having a first laser pulse duration. Further, selectively altering 506 may comprise thermally melting the plurality of light scattering features of the first recessed marking using a second laser pulse having a second laser pulse duration that is substantially longer than the first laser pulse duration.

Furthermore, selectively altering 506 the plurality of light scattering features of one of the first and second recessed markings may comprise thermally melting the plurality of light scattering features of one of the first and second recessed markings, so as to be substantially optically smooth. Selectively altering 506 the plurality of light scattering features of one of the first and second recessed markings may comprise thermally melting the plurality of light scattering features of one of the first and second recessed markings, so as to have a substantially glossy appearance. Following the block 506 of selectively altering, the marking process 500 shown in FIG. 5 can end.

FIGS. 6A-6D are diagrams illustrating marking of a substrate according to another embodiment. FIGS. 6A-6D illustrate a substrate 600, which may be a metal substrate 600. For example, the substrate 600 may comprise one of aluminum, titanium and stainless steel.

Figure 6A:
FIGS. 6A-6D are diagrams illustrating marking of a substrate according to another embodiment.
Figure 6B:
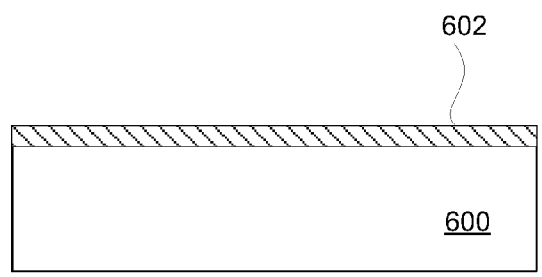

As shown in FIG. 6A, the substrate 600 may have an outer surface 602. The outer surface 602 of the substrate 600 may bead blasted and/or may be anodized, as highlighted in FIGS. 6B-6D by hatching of outer surface 602. For example, FIG. 6B highlights with hatching the outer surface 602, which may be bead blasted and/or may be anodized.

Figure 6C:
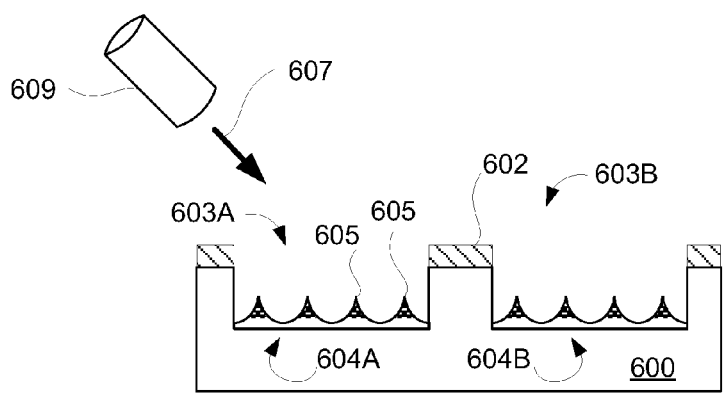

As shown in FIG. 6C, first and second recessed markings 603A, 603B may be formed by suitably selected optical energy 607 produced by a suitably selected and operated laser 609. The outer surface 602 of the substrate 600 may be substantially athermally ablated by a first laser 609, so as to provide respective first and second athermally ablated surface layer 604A, 604A of each of first and second markings 603A, 603B recessed into the outer surface 602 of the substrate 600.

The first laser 609 may include a galvanometer mirror or other arrangement for raster scanning a spot of the optical energy over the outer surface 602, so as to form the first and second recessed markings 603A, 603B. For example, laser pulses 607 from the first laser 609 may have a repetition rate of approximately one-thousand kilohertz (1000 kHz); and the spot of optical energy may be scanned at a rate of approximately two-thousand millimeters per second (2000 mm/sec). The spot of optical energy may be scanned in multiple passes of scan lines separated by a scan line pitch. For example, the spot of optical energy may be scanned in approximately two-hundred passes of scan lines separated by a scan line pitch of approximately ten microns. Various alternatives may be suitable laser models, for use as the first laser 609 in marking the substrate 600. One example is the Lumera Hyper Rapid, as discussed previously.

Substantially athermally ablating the outer surface 602 of the substrate 600 may comprise using a laser pulse 607 having a laser pulse duration that is sufficiently short for ablating the outer surface 602 substantially athermally. For example, first laser 609 may provide laser light 607 having a wavelength of approximately one-thousand-sixty-four nanometers (1064 nm), and a laser pulse duration of approximately fifteen picoseconds at approximately one Watt, which may be sufficiently short for ablating the outer surface 602 substantially athermally.

The substrate 600 shown in FIG. 6C can represent at least a portion of a housing of an electronic device. The first and second recessed markings 603A, 603B may be disposed on or adjacent the outer surface 602 the substrate 600 of the electronic device housing. The first and second recessed markings 603A, 603B being provided to the substrate 600 can provide text and/or graphics to an outer housing surface of a portable electronic device.

As a result of the substantially athermal ablation, a plurality of light scattering features 605 may be overlain on the athermally ablated surface layer (the light scattering features 605 are highlighted in FIG. 6C using dark stippling.) The light scattering features 605 may dull and/or darken appearance of the first and second recessed markings 603A, 603B shown in FIG. 6C. As will be discussed next, the plurality of light scattering features of one of the first and second recessed markings 603A, 603B may be selectively altered so that the first and second recessed markings 603A, 603B can have contrasting appearances. Melting of light scattering features 605 may provide polishing, so as to brighten and/or lighten appearance of one of the markings. Further, selective melt polishing may provide contrasting appearance, by melt polishing one of the markings but not the other of the markings.

For example, thermally melting of the light scattering features 605 of the first recessed marking 603A may provide polishing, so as to brighten and/or lighten appearance of the first recessed marking. Selective melt polishing of the first recess marking may provide contrasting appearance, by melt polishing one of the markings (e.g. first recessed marking 603A) but not the other of the markings (e.g. second recessed marking 603B.)

Figure 6D:
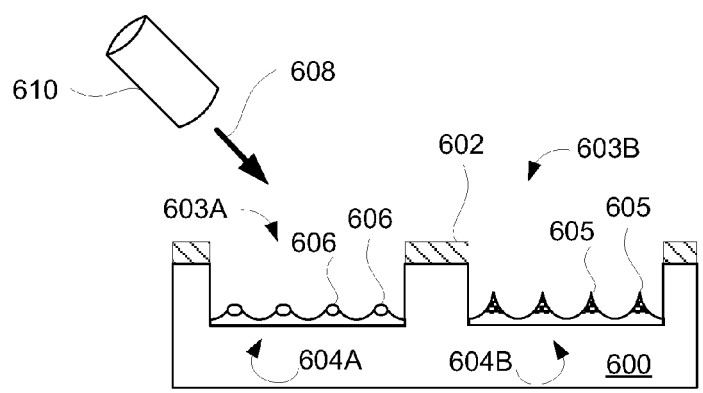

As shown in FIG. 6D, the light scattering regions as just discussed may be thermally melted to form a plurality of melted regions 606 overlaying the first athermally ablated surface layer 604A of the first recessed marking 603A. The plurality of melted regions 606 may be formed by suitably selected optical energy 608 produced by a suitably selected and operated laser 610. The plurality of melted regions 606 may be formed by a second laser 610. The second laser 610 shown in FIG. 6D may be substantially different than the first laser 609 discussed previously herein with respect to FIG. 6C.

The second laser 610 shown in FIG. 6D may include a galvanometer mirror or other arrangement for raster scanning a spot of the optical energy of the second laser 610 over the first recessed markings 603A, so as to form the plurality of melted regions 606 overlaying the first athermally ablated surface layer 604A. For example, laser pulses 608 from the second laser 610 may have a repetition rate of approximately one-hundred kilohertz (100 kHz); and the spot of optical energy of the second laser 610 may be scanned at a rate of approximately twenty millimeters per second (2000 mm/sec). The spot of optical energy may be scanned in one or more passes of scan lines separated by a scan line pitch. For example, the spot of optical energy may be scanned in one pass of scan lines separated by a scan line pitch of approximately ten microns.

Various alternatives may be suitable laser models, for use as the second laser 610, in forming the plurality of melted regions 606 overlaying the athermally ablated surface layer 604. One example is the FOBA DP20GS, as discussed previously herein.

A laser pulse 608 of the second laser 610 may have a laser pulse duration that is sufficiently long for thermally melting the plurality of light scattering features, so as to form the plurality of melted regions 606 overlaying the first athermally ablated surface layer 604A of the first recessed marking 603A as shown in FIG. 6D. For example, for laser light 608 from the second laser 610 having a wavelength of approximately one-thousand-sixty-four nanometers 1064 nm), a laser pulse duration of approximately thirty nanoseconds at approximately seven Watts may be sufficiently long for thermally melting the plurality of light scattering features.

Accordingly, from the previous discussion of FIG. 6C, it should be understood that substantially athermally ablating the outer surface of the substrate may comprise using a first laser pulse having a first laser pulse duration. Further, from the subsequent discussion of FIG. 6D, it should be understood that selectively altering by thermally melting the plurality of light scattering features of the first recessed marking 604A (so as to form the plurality of melted regions 606 as shown in FIG. 6D) may comprise using a second laser pulse having a second laser pulse duration that is substantially longer than the first laser pulse duration.

Additionally, it should be understood that the first recessed markings 603A shown in FIG. 6D may comprise the first athermally ablated surface layer 604A, and a plurality of melted regions 606 overlaying the first athermally ablated surface layer 604A, as shown in FIG. 6D. The first athermally ablated surface layer 604A and/or the plurality of melted regions 606 overlaying the first athermally ablated surface layer 604A may be substantially optically smooth.

The plurality of melted regions 606 may have a substantially glossy appearance. The plurality of melted regions 606 overlaying the first athermally ablated surface layer 604A may have a level of specular reflection that is substantially similar to a level of specular reflection of the outer surface 602 of the electronic device housing.

As mentioned previously, at least a portion of the outer surface 602 of the electronic device housing may have a bead blasted appearance. The plurality of melted regions 606 overlaying the first athermally ablated surface layer 604 of the first recessed marking may have an appearance that is substantially similar to the bead blasted appearance of the outer surface 602 of the electronic device housing.

In view of all of the foregoing, it should be understood that the first and second recessed markings 603A, 603B shown in FIG. 6D may have contrasting appearances.

The first recessed marking 603A may have a substantially lighter appearance than the second recessed marking 603B. The first recessed marking 603A may comprise the plurality of melted regions 606 overlain on the first ablated surface layer 604A of the first recessed marking 603A, so as to provide for the substantially lighter appearance of the first recessed marking 603A. Providing contrast, the light scattering features 605 may dull and/or darken appearance of the second recessed markings 603B shown in FIG. 6D.

Figure 7A:
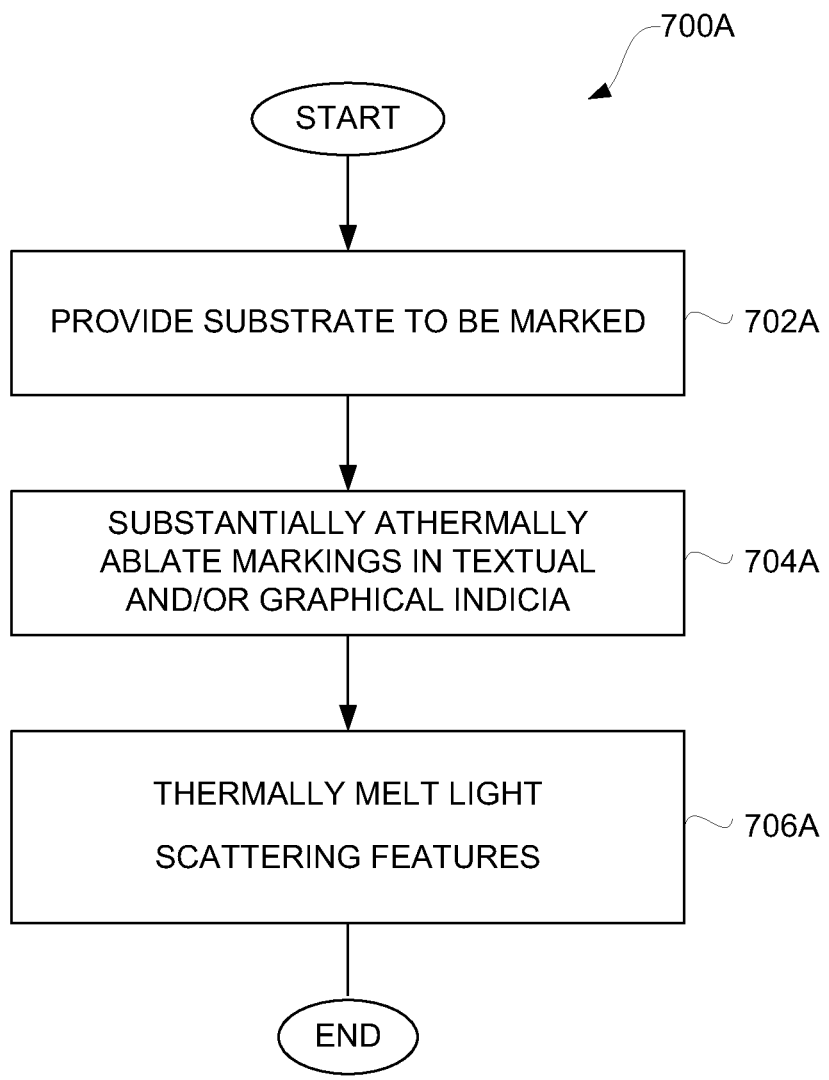
FIGS. 7A and 7B are flow diagrams of marking processes according to other embodiments.
Figure 7B:
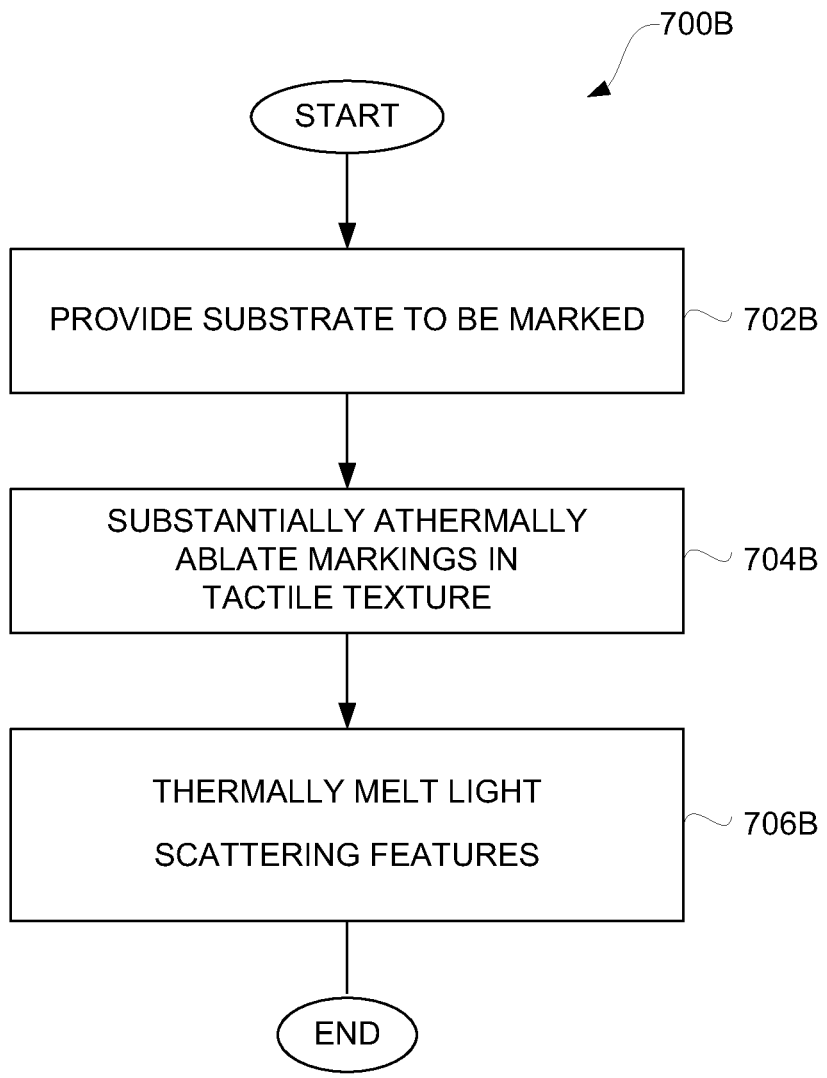

FIGS. 7A and 7B are flow diagrams of marking processes according to other embodiments. FIG. 7A is a flow diagram of a marking process 700A according to one embodiment. The marking processes 700A can be performed on an electronic device that is to be marked, or more generally on an article to be marked. The marking processes 700A is for example, suitable for applying text or graphics to a housing (e.g., an outer housing surface) of an electronic device. The marking process 700A can provide a metal structure and/or metal substrate for the article to be marked.

In accordance with the marking process 700A shown in FIG. 7A, the process may begin with providing 702A the substrate to be marked. As mentioned previously, the substrate may have an outer surface. In some embodiments the outer surface may be bead blasted and/or anodized.

After the substrate of the electronic device housing has been provided 702A, the outer surface of the substrate may be substantially athermally ablated 704A, so as to provide an athermally ablated surface layer of markings recessed into the outer surface of the substrate. The markings may be arranged in one or more textual or graphical indicia on the outer surface of the substrate.

Substantially athermally ablating 704A the outer surface of the substrate may comprise using a laser pulse having a laser pulse duration that is sufficiently short for ablating the outer surface substantially athermally. For example, as will be discussed in greater detail subsequently herein, for laser light having a wavelength of approximately one-thousand-sixty-four nanometers 1064 nm), a laser pulse duration of approximately fifteen picoseconds at approximately one Watt may be sufficiently short for ablating the outer surface substantially athermally. Athermal ablation may be substantial as a significant aspect of the ablation. Athermal ablation may be substantial in that athermal ablation processes may predominate in effect over other processes.

As a result of the substantially athermal ablation, a plurality of light scattering features may be overlain on the athermally ablated surface layer. The light scattering features may be undesirable, and may dull and/or darken appearance of the markings. As will be discussed next, melting of light scattering features may provide polishing, so as to brighten and/or lighten appearance of the markings.

After the outer surface of the substrate has been substantially athermally ablated 704A, the plurality of light scattering features may be thermally melted 706A, so as to provide a plurality of melted regions overlaying the athermally ablated surface layer. Thermally melting 706A the plurality of light scattering features may comprise using a laser pulse having a laser pulse duration that is sufficiently long for thermally melting the plurality of light scattering features. For example, as will be discussed in greater detail subsequently herein, for laser light having a wavelength of approximately one-thousand-sixty-four nanometers (1064 nm), a laser pulse duration of approximately thirty nanoseconds at approximately seven Watts may be sufficiently long for thermally melting the plurality of light scattering features.

Accordingly, from the foregoing it should be understood that substantially athermally ablating 704A the outer surface of the substrate may comprise using a first laser pulse having a first laser pulse duration. Further, thermally melting 706A the plurality of light scattering features may comprise using a second laser pulse having a second laser pulse duration that is substantially longer than the first laser pulse duration.

Thermally melting 706A the plurality of light scattering features may comprise making the plurality of melted regions substantially optically smooth. The plurality of melted regions may have a substantially glossy appearance. Following the block 706A of thermally melting the plurality of light scattering features, the marking process 700A shown in FIG. 7A can end.

FIG. 7B is a flow diagram of a marking process 700B according to one embodiment. The marking processes 700B can be performed on an electronic device that is to be marked, or more generally on an article to be marked. The marking processes 700B is for example, suitable for applying a tactile texture to a housing (e.g., an outer housing surface) of an electronic device. The marking process 700B can provide a metal structure and/or metal substrate for the article to be marked.

In accordance with the marking process 700B shown in FIG. 7A, the process may begin with providing 702B the substrate to be marked. As mentioned previously, the substrate may have an outer surface. In some embodiments the outer surface may be bead blasted and/or anodized.

After the substrate of the electronic device housing has been provided 702A, the outer surface of the substrate may be substantially athermally ablated 704A, so as to provide an athermally ablated surface layer of markings recessed into the outer surface of the substrate. The markings may be arranged in a tactile texture on the outer surface the substrate. In some embodiments, the tactile texture may comprise knurling.

Substantially athermally ablating 704B the outer surface of the substrate may comprise using a laser pulse having a laser pulse duration that is sufficiently short for ablating the outer surface substantially athermally. For example, as will be discussed in greater detail subsequently herein, for laser light having a wavelength of approximately one-thousand-sixty-four nanometers 1064 nm), a laser pulse duration of approximately fifteen picoseconds at approximately one Watt may be sufficiently short for ablating the outer surface substantially athermally. Athermal ablation may be substantial as a significant aspect of the ablation. Athermal ablation may be substantial in that athermal ablation processes may predominate in effect over other processes.

As a result of the substantially athermal ablation, a plurality of light scattering features may be overlain on the athermally ablated surface layer. As mentioned previously, the light scattering features may be undesirable, and may dull and/or darken appearance of the markings. As will be discussed next, melting of light scattering features may provide polishing, so as to brighten and/or lighten appearance of the markings.

After the outer surface of the substrate has been substantially athermally ablated 704A, the plurality of light scattering features may be thermally melted 706A, so as to provide a plurality of melted regions overlaying the athermally ablated surface layer. Thermally melting 706B the plurality of light scattering features may comprise using a laser pulse having a laser pulse duration that is sufficiently long for thermally melting the plurality of light scattering features. For example, as will be discussed in greater detail subsequently herein, for laser light having a wavelength of approximately one-thousand-sixty-four nanometers (1064 nm), a laser pulse duration of approximately thirty nanoseconds at approximately seven Watts may be sufficiently long for thermally melting the plurality of light scattering features.

Accordingly, from the foregoing it should be understood that substantially athermally ablating 704B the outer surface of the substrate may comprise using a first laser pulse having a first laser pulse duration. Further, thermally melting 706B the plurality of light scattering features may comprise using a second laser pulse having a second laser pulse duration that is substantially longer than the first laser pulse duration.

Thermally melting 706B the plurality of light scattering features may comprise making the plurality of melted regions substantially optically smooth. The plurality of melted regions may have a substantially glossy appearance. Following the block 706B of thermally melting the plurality of light scattering features, the marking process 700B shown in FIG. 7B can end.

Figure 8A:
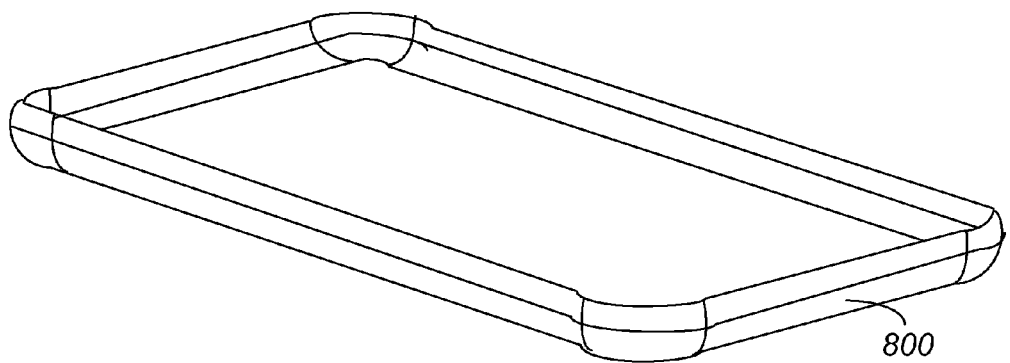
FIG. 8A is a diagrammatic representation of an exemplary product housing.

FIG. 8A is a diagrammatic representation of an example product housing 800. The housing may be formed using aluminum or another suitable metal. The housing 800 may be a housing that is to be a part of an overall assembly, as for example a bottom of a cell phone assembly or portable media player.

Figure 8B:
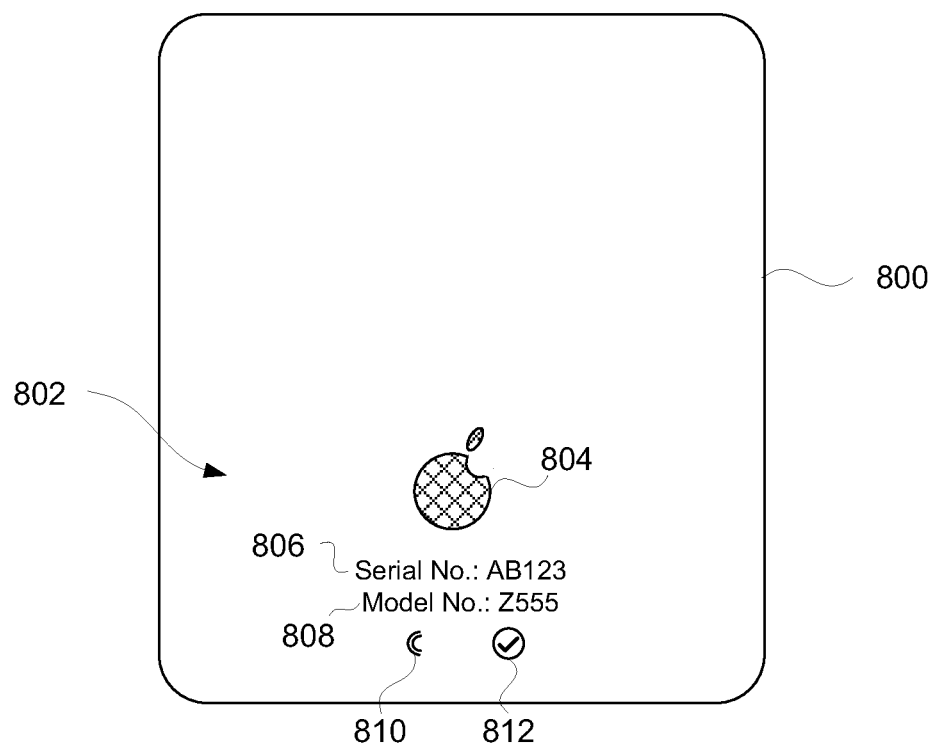
FIG. 8B illustrates the product housing having markings according to one example embodiment.

FIG. 8B illustrates the product housing 800 having markings 802 according to one exemplary embodiment. The markings 802 can be dull and/or dark markings in accordance with the dull and/or dark markings discussed previously herein. Alternatively or additionally, the markings 802 can be light markings in accordance with the light markings discussed previously herein. Further, the markings 802 can be contrasting light and dark markings. In this example, the labeling includes a logo graphic 804, serial number 806, model number 808, and certification/approval marks 810 and 812.

In some embodiments a tactile texture may be used. For example, logo graphic 804 may comprise a tactile texture. In some embodiments, the tactile texture may comprise knurling. For example, cross hatching is used in FIG. 8B for representative illustration of knurling in the tactile texture of logo graphic 804. The tactile texture of the logo graphic 804 can employ light markings, in accordance with the light markings discussed previously herein.

Figure 9:
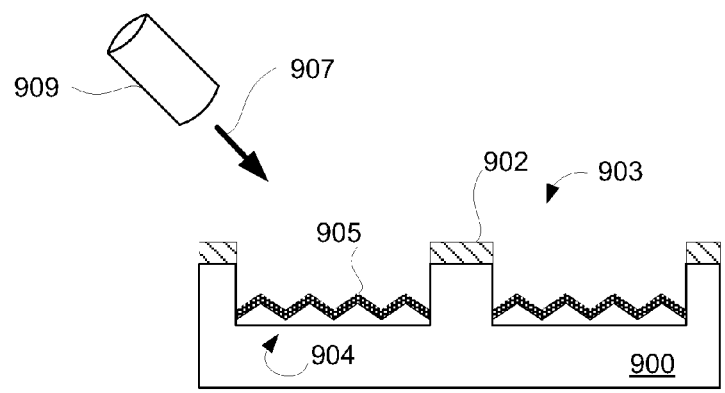
FIG. 9 shows an alternative depiction that is substantially similar to what is shown in FIGS. 4C and 6C.
Figure 10:
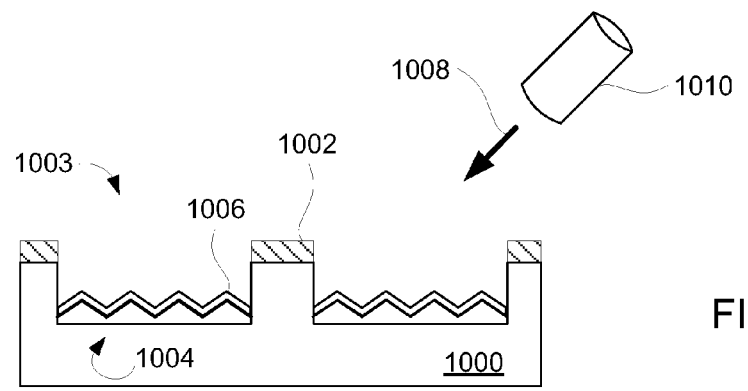
FIG. 10 shows an alternative depiction that is substantially similar to what is shown in FIG. 4D.
Figure 11:
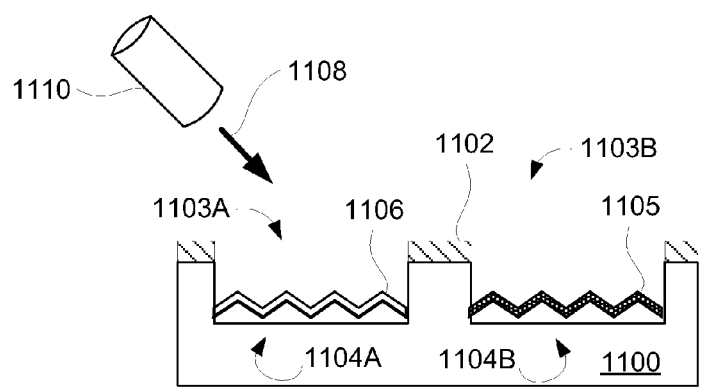
FIG. 11 shows an alternative depiction that is substantially similar to what is shown in FIG. 6D.

FIG. 9 shows an alternative depiction that is substantially similar to what is shown in FIGS. 4C and 6C and what is discussed previously herein with respect to FIGS. 4C and 6C. Similar to what was discussed previously herein with respect to FIGS. 4C and 6C, FIG. 9 shows substrate 900, outer surface 902, recessed markings 903, athermally ablated surface layer 904, plurality of light scattering features 905, and first laser 909 and corresponding optical energy 907. However, from the alternative depiction of FIG. 9, it should be understood that prior to melting, the plurality of light scattering features 905 may substantially cover and/or may entirely cover a surface of the athermally ablated surface layer 904. FIG. 10 shows an alternative depiction that is substantially similar to what is shown in FIG. 4D and what is discussed previously herein with respect to FIG. 4D. Similar to what was discussed previously herein with respect to FIG. 4D, FIG. 10 shows substrate 1000, outer surface 1002, recessed markings 1003, athermally ablated surface layer 1004, plurality of melted regions 1006, and second laser 1010 and corresponding optical energy 1008. However, from the alternative depiction of FIG. 10, it should be understood that after melting the plurality of melted regions 1006 may substantially cover and/or may entirely cover a surface of the athermally ablated surface layer 1004. FIG. 11 shows an alternative depiction that is substantially similar to what is shown in FIG. 6D and what is discussed previously herein with respect to FIG. 6D. Similar to what was discussed previously herein with respect to FIG. 6D, FIG. 11 shows substrate 1100, outer surface 1102, first and second recessed markings 1103A, 1103B, first and second athermally ablated surface layers 1104A, 1104B, plurality of light scattering features 1105, plurality of melted regions 1106, and second laser 1110 and corresponding optical energy 1108. From the alternative depiction of FIG. 11, it should be understood that the plurality of melted regions 1106 may substantially cover and/or may entirely cover a surface of the first athermally ablated surface layer 1004A. From the alternative depiction of FIG. 11, it should be understood that the plurality of light scattering features 1105 may substantially cover and/or may entirely cover a surface of the second athermally ablated surface layer 1104B.

The marking processes described herein are, for example, suitable for applying text or graphics to a housing surface (e.g., an outer housing surface) of an electronic device. The marking processes are, in one embodiment, particularly well-suited for applying text and/or graphics to an outer housing surface of a portable electronic device. Examples of portable electronic devices include mobile telephones (e.g., cell phones), Personal Digital Assistants (PDAs), portable media players, remote controllers, pointing devices (e.g., computer mouse), game controllers, etc. The portable electronic device can further be a hand-held electronic device. The term hand-held generally means that the electronic device has a form factor that is small enough to be comfortably held in one hand. A hand-held electronic device may be directed at one-handed operation or two-handed operation. In one-handed operation, a single hand is used to both support the device as well as to perform operations with the user interface during use. In two-handed operation, one hand is used to support the device while the other hand performs operations with a user interface during use or alternatively both hands support the device as well as perform operations during use. In some cases, the hand-held electronic device is sized for placement into a pocket of the user. By being pocket-sized, the user does not have to directly carry the device and therefore the device can be taken almost anywhere the user travels (e.g., the user is not limited by carrying a large, bulky and often heavy device).

Additional information on product marking as well as other manufacturing techniques and systems for electronic devices are contained in U.S. patent application Ser. No. 13/021,641, filed Feb. 4, 2011, and entitled "Marking of Product Housings" which is hereby incorporated herein by reference.

The various aspects, features, embodiments or implementations of the invention described above can be used alone or in various combinations.

Different aspects, embodiments or implementations may, but need not, yield one or more of the following advantages. One advantage may be that the light markings may provide an aesthetically pleasing and/or desired appearance. In particular, since the outer surface may have a bead blasted appearance, providing light markings having an appearance that is substantially similar to the bead blasted appearance of the outer surface may be aesthetically pleasing and/or desired. Another advantage may be that contrasting markings may be clearly distinguished from one another. Another advantage may be that substantially athermal laser ablation followed by laser melt polishing may form markings with a pleasing visual appearance that may also be formed with high resolution and/or precision.

The many features and advantages of the present invention are apparent from the written description. Further, since numerous modifications and changes will readily occur to those skilled in the art, the invention should not be limited to the exact construction and operation as illustrated and described. While use of laser light having a wavelength of approximately one-thousand-sixty-four nanometers (1064 nm) has been discussed, it should be understood that other suitable wavelengths may be used, for example, such as approximately 532 nanometer and/or approximately 355 nanometer, Accordingly, laser markings as discussed may comprise at least one of approximately 1064 nanometer laser markings, approximately 532 nanometer laser markings and approximately 355 nanometer laser markings.

Further, laser pulses may be used having pulse width that may be sufficiently brief to ablate substantially athermally. Accordingly the laser markings may comprise laser pulse markings of laser pulses that are sufficiently brief to ablate substantially athermally. For example, in additional to laser parameters discussed previously herein, substantially athermal ablation may likewise be performed using laser pulses employing various other laser operating parameters (e.g. a pulse duration of approximately four nanoseconds at approximately twenty Watts; a repetition rate of approximately five hundred kilohertz (500 kHz); and a scan rate of approximately two-thousand millimeters per second (2000 mm/sec) at a scan line pitch of approximately five microns.) More generally, substantially athermal ablation may be performed using laser pulses having pulse width within a range from approximately one or more picoseconds to less than approximately ten nanoseconds. Accordingly, laser markings may comprise laser pulse markings of laser pulses having pulse width within the range from approximately picoseconds to less than approximately ten nanoseconds, so as to ablate substantially athermally.

As another example, thermal melt polishing may likewise be performed using laser pulses employing various other laser operating parameters (e.g. a pulse duration of approximately two-hundred nanoseconds at approximately nine Watts; a repetition rate of approximately five hundred kilohertz (500 kHz); and a scan rate of approximately one-thousand millimeters per second (1000 mm/sec) at a scan line pitch of approximately five microns.) More generally, for the laser melt polishing laser pulses may be used having pulse width within a range from approximately twenty nanoseconds to approximately a microsecond or more. Accordingly, the melted regions overlaying the athermally ablated surface layer may comprise laser pulse melted regions of laser pulses having pulse width within a range from approximately twenty nanoseconds to approximately a microsecond or more.

Hence, in view of all of the foregoing, it should be understood that all suitable modifications and equivalents may be resorted to as falling within the scope of the invention.

What is claimed is:

1. An electronic device housing comprising:
a substrate of the electronic device housing, the substrate having an outer surface; and
recessed markings disposed on the outer surface of the substrate of the electronic device housing, wherein the recessed markings comprise an athermally ablated surface layer, and a plurality of melted regions overlaying the athermally ablated surface layer.

2. An electronic device housing as recited in claim 1 wherein the athermally ablated surface layer is substantially optically smooth.

3. An electronic device housing as recited in claim 1 wherein the plurality of melted regions overlaying the athermally ablated surface layer are substantially optically smooth.

4. An electronic device housing as recited in claim 1 wherein the plurality of melted regions have a substantially glossy appearance.

5. An electronic device housing as recited in claim 1 wherein the plurality of melted regions overlaying the athermally ablated surface layer have a level of specular reflection that is substantially similar to a level of specular reflection of the outer surface of the electronic device housing.

6. An electronic device housing as recited in claim 1 wherein at least a portion of the outer surface of the electronic device housing has a bead blasted appearance.

7. An electronic device housing as recited in claim 6 wherein the plurality of melted regions overlaying the athermally ablated surface layer have an appearance that is substantially similar to the bead blasted appearance of the outer surface of the electronic device housing.

8. An electronic device housing as recited in claim 1 wherein:
the recessed markings further comprise at least one sidewall adjacent to the athermally ablated surface layer; and
the outer surface of the substrate is substantially perpendicular to the sidewall adjacent to the athermally ablated surface layer.

9. An electronic device housing as recited in claim 1 wherein the outer surface has an appearance that is substantially free of thermal artifacts.

10. An electronic device housing as recited in claim 1 wherein the substrate comprises metal.

11. An electronic device housing as recited in claim 1 wherein the substrate comprises anodized metal.

12. An electronic device housing as recited in claim 1 wherein the substrate comprises one of aluminum, titanium and stainless steel.

13. An apparatus comprising:
a substrate having an outer surface; and
first and second recessed markings disposed on the outer surface of the substrate, wherein the first and second recessed markings have contrasting appearances, wherein each of the first and second recessed markings comprises a respective ablated surface layer, and wherein the first recessed markings comprises a plurality of melted regions overlain on the ablated surface layer,
wherein the ablated surface layers are ablated substantially athermally.

14. An apparatus as recited in claim 13 wherein:
the first recessed marking has a substantially lighter appearance than the second recessed marking.

15. An apparatus comprising:
a substrate having an outer surface; and
recessed markings arranged in one or more textual or graphical indicia on the outer surface of the substrate, wherein the recessed markings comprise an athermally ablated surface layer, and a plurality of melted regions overlaying the athermally ablated surface layer.

16. An apparatus as recited in claim 15 wherein the recessed markings are laser markings.

17. An apparatus as recited in claim 16 wherein the laser markings comprise at least one of approximately 1064 nanometer laser markings, approximately 532 nanometer laser markings and approximately 355 nanometer laser markings.

18. An apparatus as recited in claim 16 wherein the laser markings comprise laser pulse markings of laser pulses that are sufficiently brief to ablate substantially athermally.

19. An apparatus as recited in claim 18 wherein the sufficiently brief laser pulses substantially avoid an appearance of at least one of burr, melt and discoloration at the outer surface.

20. An apparatus as recited in claim 16 wherein the laser markings comprise laser pulse markings of laser pulses having pulse width within a range from approximately one picosecond to less than approximately ten nanoseconds, so as to ablate substantially athermally.

21. An apparatus as recited in claim 15 wherein the melted regions overlaying the athermally ablated surface layer comprise laser pulse melted regions of laser pulses having pulse width within a range from approximately twenty nanoseconds to approximately one microseconds.

22. An apparatus comprising:
a substrate having an outer surface; and
recessed markings arranged in a tactile texture on the outer surface of the substrate, wherein the recessed markings comprise an athermally ablated surface layer, and a plurality of melted regions overlaying the athermally ablated surface layer.

23. An apparatus as recited in claim 22 wherein tactile texture on the outer surface of the substrate comprises knurling.

* * * * *